(12) United States Patent
Gupta et al.

(10) Patent No.: US 9,214,943 B1
(45) Date of Patent: Dec. 15, 2015

(54) FRACTIONAL FREQUENCY DIVIDER

(71) Applicants: Akshat Gupta, New Delhi (IN); Simon J. Gallimore, Austin, TX (US); Deepak Negi, Noida (IN); Garima Sharda, Ghaziabad (IN)

(72) Inventors: Akshat Gupta, New Delhi (IN); Simon J. Gallimore, Austin, TX (US); Deepak Negi, Noida (IN); Garima Sharda, Ghaziabad (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/516,559

(22) Filed: Oct. 16, 2014

(51) Int. Cl.
*H03K 21/10* (2006.01)
*H03K 23/68* (2006.01)

(52) U.S. Cl.
CPC ............... *H03K 21/10* (2013.01); *H03K 23/68* (2013.01)

(58) Field of Classification Search
CPC ..... H03K 21/08; H03K 21/10; H03K 23/486; H03K 23/507; H03K 23/586; H03K 23/662; H03K 23/667; H03K 23/68
See application file for complete search history.

(56) References Cited

U.S. PATENT DOCUMENTS

| | | | |
|---|---|---|---|
| 5,088,057 A * | 2/1992 | Amrany | G06F 7/68 377/48 |
| 6,040,725 A | 3/2000 | Lee et al. | |
| 6,061,418 A | 5/2000 | Hassoun | |
| 6,861,881 B1 | 3/2005 | Neravetla et al. | |
| 7,205,800 B2 * | 4/2007 | Hasegawa | H03K 23/52 327/115 |
| 8,081,017 B2 * | 12/2011 | Shibayama | G06F 1/08 327/115 |
| 8,253,450 B2 * | 8/2012 | Shibayama | G06F 1/08 327/115 |
| 8,369,477 B2 * | 2/2013 | Shibayama | G06F 1/08 377/47 |
| 8,406,371 B1 | 3/2013 | Barale et al. | |
| 8,422,619 B2 * | 4/2013 | Shibayama | G06F 1/04 327/115 |
| 8,432,061 B2 | 4/2013 | Chu | |
| 8,558,589 B2 * | 10/2013 | Dahan | G06F 1/04 327/115 |
| 8,564,336 B2 * | 10/2013 | Shibayama | G06F 1/06 327/115 |
| 2012/0001665 A1 | 1/2012 | Regimbal et al. | |

FOREIGN PATENT DOCUMENTS

CN 202978893 U 6/2013

* cited by examiner

*Primary Examiner* — Patrick O'Neill
(74) *Attorney, Agent, or Firm* — Charles Bergere

(57) ABSTRACT

A fractional frequency divider counts pulses of a digital input clock signal and enables a clock gating module when a preset count is reached. The clock gating module combines the outputs of two clock gating cells that receive, respectively, the input clock signal and an inverted version of the input clock signal. Output pulses are produced on both positive and negative edges of the input clock signal. This permits generation of output clock pulses that can be set to have a spacing and width granularity of half an input clock period, giving the advantages of low jitter and fine duty cycle control.

5 Claims, 5 Drawing Sheets

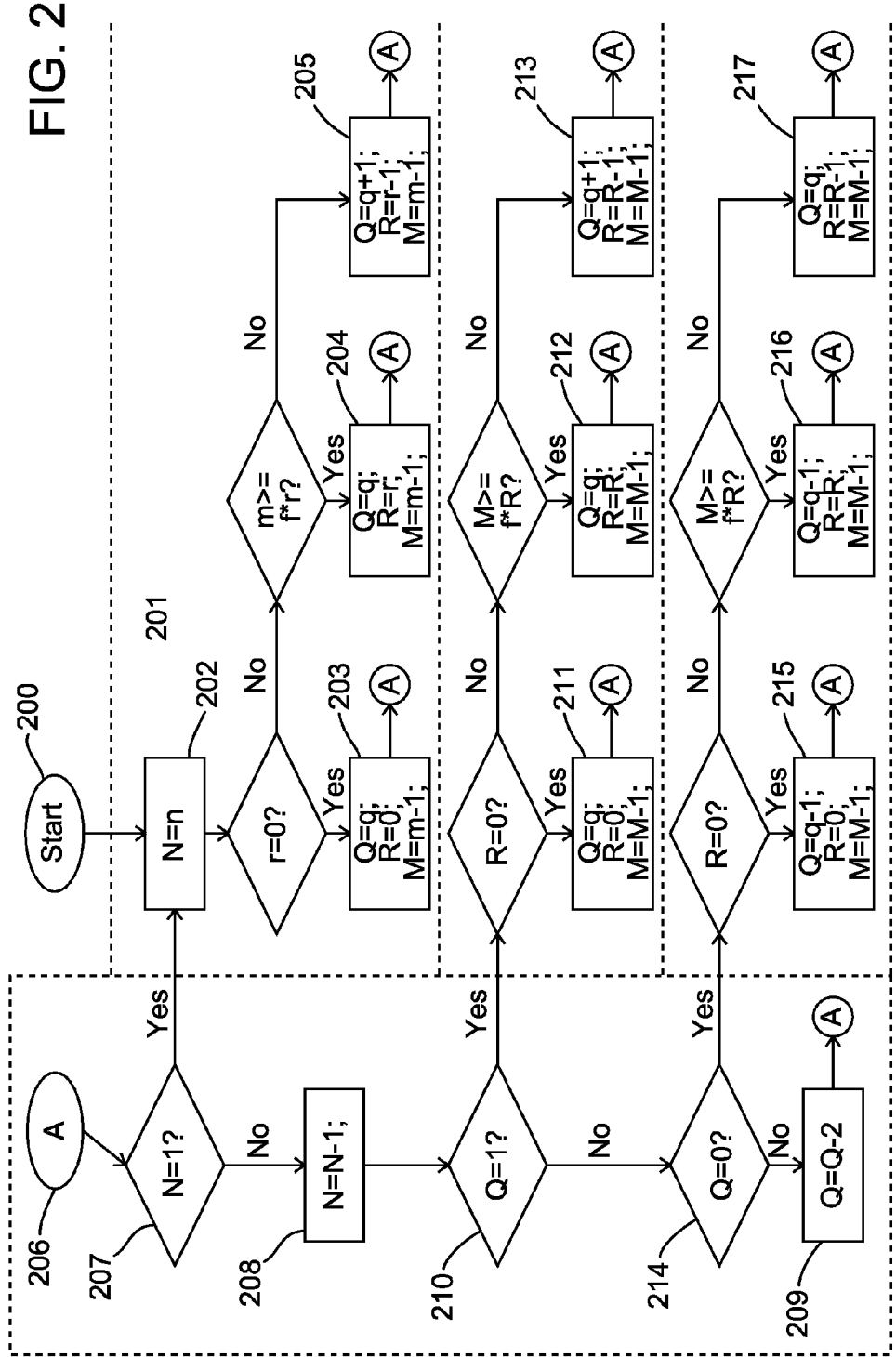

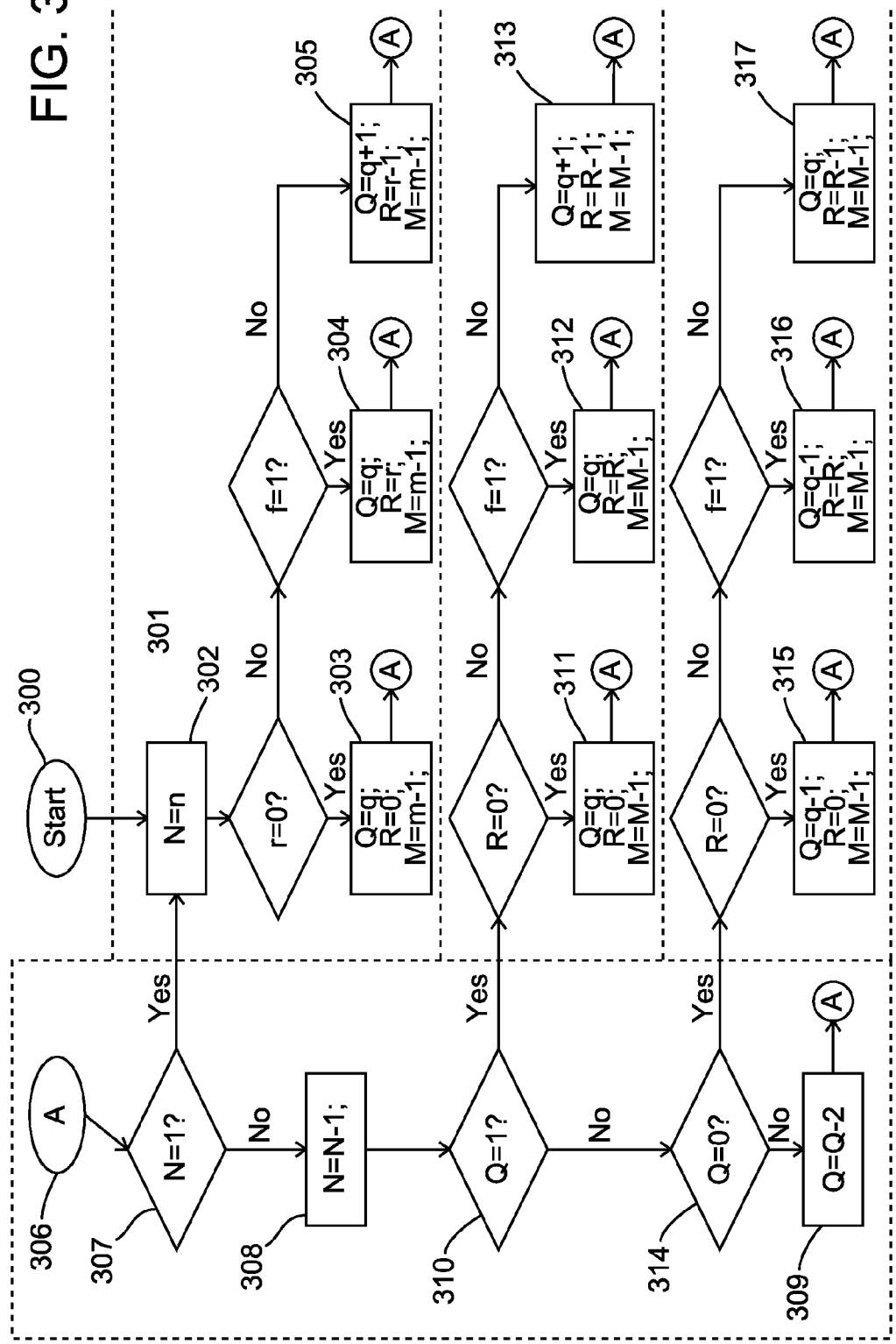

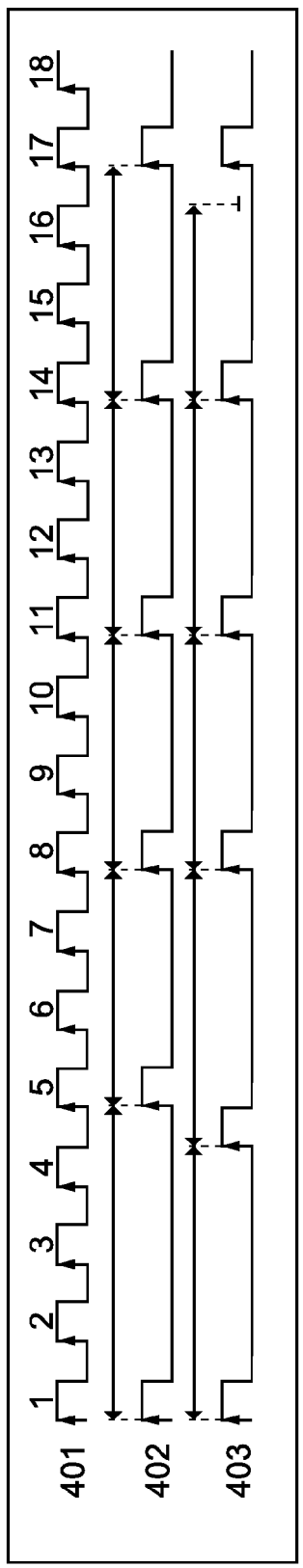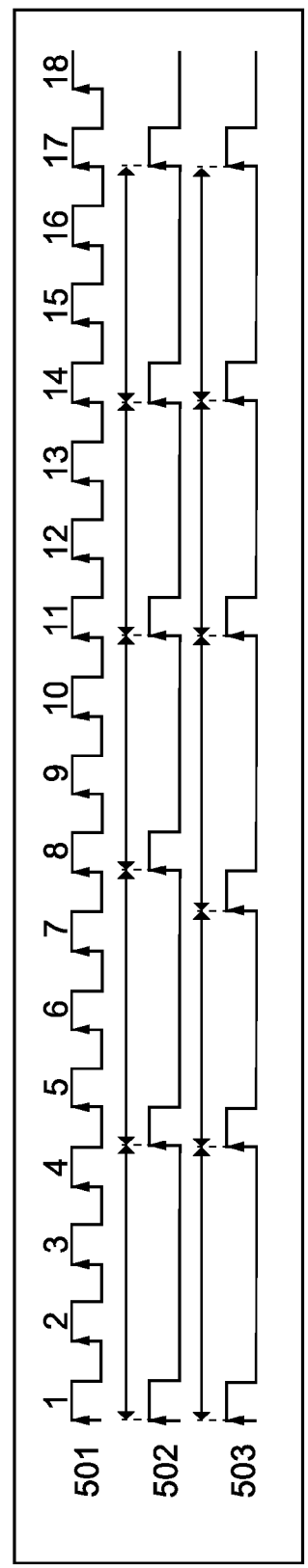

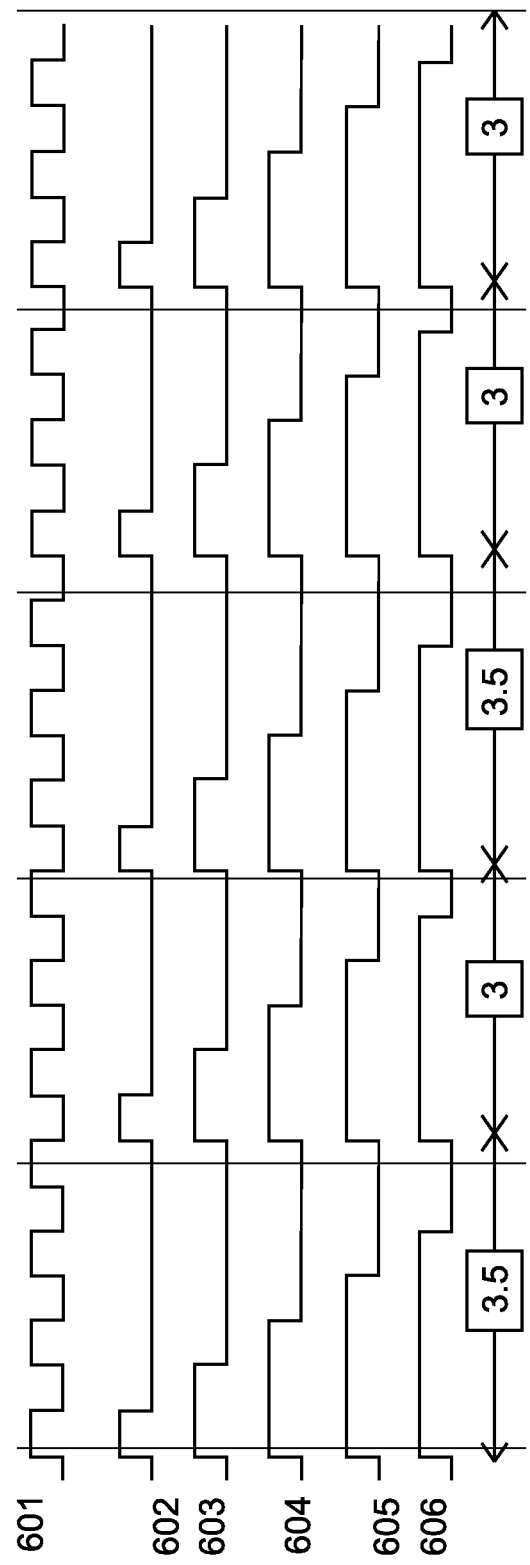

FRACTIONAL FREQUENCY DIVIDER

BACKGROUND OF THE INVENTION

The present invention relates generally to integrated circuits and, more particularly, to a fractional frequency divider suitable for performing division of a digital clock or timing signal.

Fractional frequency dividers typically perform division by a fraction m/n where a divided signal has 'm' pulses for every 'n' pulses of an original signal (where 'm' and 'n' are integers and 'm' is less than 'n'), thus allowing a digital waveform to be divided by non-integer values.

In one known fractional frequency divider, an integer divider performs a frequency division based on a variable divisor that is controlled by a Delta Sigma modulator. One problem with known fractional frequency dividers is the problem of overrun and underrun due to an uncontrolled duty cycle. A configurable duty cycle is particularly advantageous in NAND Flash Controller applications where a divided output clock having a duty cycle to match the requirements of its associated Flash memory unit is required. A further problem with known arrangements is jitter, which is the unwanted variation of the divided clock period over time.

It would be advantageous to provide a fractional frequency divider that mitigates the drawbacks of the known arrangements.

BRIEF DESCRIPTION OF THE DRAWINGS

The invention, together with objects and advantages thereof, may best be understood by reference to the following description of preferred embodiments together with the accompanying drawings in which:

FIG. 2 is a flow chart illustrating a first method of operation of counters included in an embodiment of the present invention;

FIG. 3 is a flow chart illustrating a second method of operation of counters included in an embodiment of the present invention; and FIGS. 4 to 6 are waveform diagrams illustrating divided clock signals that can be generated by a frequency divider of the present invention.

DETAILED DESCRIPTION OF PREFERRED EMBODIMENTS

Figure 1:
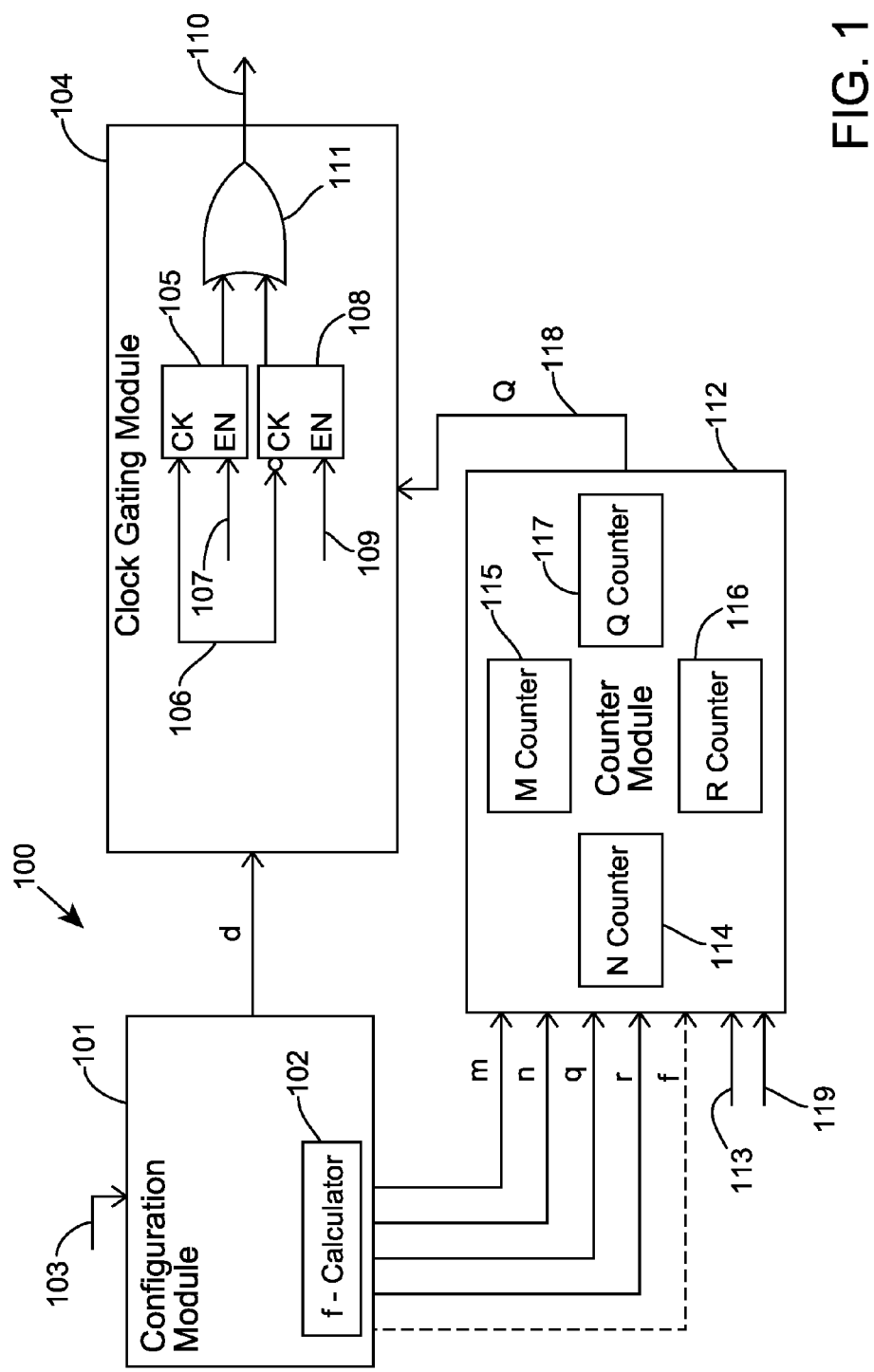
FIG. 1 is a simplified schematic block diagram of an m:n fractional frequency divider in accordance with an embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout.

Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a fractional frequency divider for dividing a digital input clock signal by a fraction m/n, where a divided output signal has m pulses for every n pulses of the input signal. The fractional frequency divider comprises a counter for counting input clock signal pulses, a first clock gate for receiving the input clock signal and a second clock gate for receiving an inverted version of the input clock signal. The first and second clock gates enable a pulse of the input clock signal and a pulse of the inverted version of the input clock signal to pass to respective outputs thereof when an output of the counter reaches a pre-set value. A combiner circuit combines the outputs of the first and second clock gates.

In another embodiment, the present invention provides a method of dividing a digital input clock signal by a fraction m/n, where a divided output signal has m pulses for every n pulses of the input signal. The method includes the steps of: receiving the input clock signal at a counter and at a first clock gate; receiving an inverted version of the input clock signal at a second clock gate; counting input pulses in the counter; when an output of the counter reaches a pre-set value, enabling a pulse of the input clock signal to pass through the first clock gate to an output thereof, and enabling a pulse of the inverted version of the input clock signal to pass through the second clock gate to an output thereof; and combining the outputs of the first and second clock gates.

By enabling the input clock and an inverted version of the input clock and combining the two, use can be made of the negative edges of the input clock in addition to the positive edges. This use of both edges of the input clock can provide low-jitter and good control over the duty-cycle of the divided output clock signal.

Referring now to FIG. 1, a simplified schematic block diagram of an m:n fractional frequency divider 100 in accordance with an embodiment of the present invention is shown. The fractional frequency divider 100 includes a configuration module 101 that incorporates a calculator module 102. The configuration module 101 receives, from an external source (not shown), a digital input clock signal on an input line 103. In one example, the digital input clock signal has a 50% duty cycle.

The configuration module 101 is operably coupled to a clock gating module 104. The clock gating module 104 includes a first clock gating cell 105 that receives, at a clock input thereof, the digital input clock signal on a line 106. The first clock gating cell 105 has an enable input for receiving a first enable signal on a line 107. The clock gating module 104 also includes a second clock gating cell 108 that receives, at an input thereof, an inverted version of the digital input clock signal. The second clock gating cell 108 has an enable input for receiving a second enable signal on a line 109. In this embodiment, outputs of the clock gating cells 105 and 108 are ORed to produce a divided output clock signal on line 110 by an OR gate 111.

The configuration module 101 and the clock gating module 104 are both operably coupled to a counter module 112. The counter module 112 receives the digital input clock signal on an input line 113. The counter module 112 also receives, from the configuration module 101, a plurality of parameters: m, n, q, r, and f. The counter module 112 comprises four counters referred to herein as an N counter 114, an M counter 115, an R counter 116 and a Q counter 117. An output 'Q' of the Q counter 117 is output on line 118 from the counter module 112 to the clock gating module 104. A load_enable input signal is fed to the counter module 112 on line 119.

An input 'd', which is fed from the configuration module 101 to the clock gating module 104, is a duty cycle input that is used to set a configurable duty cycle of the generated divided output clock signal.

The parameters 'm,' 'n,' 'q,' 'r.' and 'f,' which are all fed into the counter module 112 are defined as follows.

The parameter 'm' is the numerator of the m:n fractional frequency divider 100 of FIG. 1. The numerator is programmed in the configuration module 101 as to equal 'm.' The parameter 'm−1' is initially loaded into the 'M' counter 115.

The parameter 'n' is the denominator of the m:n fractional frequency divider 100 of FIG. 1. The denominator is programmed in the configuration module 101 as equal to 'n.' The 'N' counter N is loaded with the value of 'n' at the start of an output clock generation process, that is, when a load_enable pulse on line 119 is received by the counter module 112. The 'N' counter is implemented as a down-counter and is reloaded with the value of 'n' whenever it counts down to a value of 1.

The parameter 'q' is the 'q' quotient and is programmed in the configuration module 101 as equal to 'quotient (2n/m)−1.' The Q counter is loaded with either the value 'q' or the value 'q+1' at the start of the output clock generation process and its output varies between 0 and the loaded value. The Q counter is implemented as a down-counter that decrements by 2 with every input-clock pulse. While down-counting, when Q reaches 0 (instead of 1), it is further decremented by 1 at the start of the next input clock cycle. An output 'Q' of the Q counter is fed to the clock gating module 104 and in conjunction with the 'd' input to the clock gating module enables the input clock signal, thereby generating a divided clock output 110 of the clock gating module 104 with a configurable duty cycle. Whenever the output of the Q counter reaches 0 or 1, the clock gating module 104 generates a divided output clock signal using positive or negative edges of the input clock. Whenever Q is less than or equal to 'd', the output clock signal is high, otherwise it is low.

The parameter 'r' is a remainder and is programmed into the configuration module as equal to 'remainder (2n/m}.' The parameter 'r' equates to the number of times that Q is loaded with the value 'q+1.' 'm−r' is the number of times Q is loaded with the value 'q.'

The parameter 'f' can have one of several fixed, programmed values or can be calculated in the 'f-calculator' module 102. A calculated value for 'f' can give a better jitter performance of the generated divided clock signal. The parameter 'f' assists in evening out the distribution of the instants in time when the 'Q' counter is reloaded with the value 'q+1. 'f'=0, if 'r'=0; 'f'='quotient(m/r)' if this value is an integer, otherwise, f=quotient(m/r)+1.

An example of the operation of the N, M, R and Q counters of the counter module 112 of FIG. 1 will now be described with reference to FIG. 2. In this example, the parameter 'f' is programmed to have a fixed value. A counting process starts at 200 and enters an initial phase 201 in which the counters are loaded at steps 202 and 203, 204, or 205. When the counters have been loaded, the process moves on to step 'A' at 206 and the counters run. The loading phase 201 repeats each time the N counter reaches a count of 1 (at 207). If 'r' is 0 (and 'f' is also 0) then (at 203) the Q counter is loaded with the value q, the R counter is loaded with the value 0 and the M counter is loaded with the value m−1. If 'r' has a value other than 0 (in which case 'f' is non-zero) and m is greater than or equal to the product of 'f' times 'r,' then (at 204) the Q counter is loaded with the value q, the R counter is loaded with the value r and the M counter is loaded with the value m−1. If r has a value other than 0 and m is not greater than or equal to the product of 'f' times 'r,' then (at 205) the Q counter is loaded with the value q+1, the R counter is loaded with the value r−1 and the M counter is loaded with the value m−1.

Until the N counter expires (at a count value of 1), it decrements by one count, at 208, for every input clock pulse. Until the Q counter expires (at a value of either 0 or 1), it decrements by two counts, at 209, for every input clock pulse and the process reverts to step 'A' at 206.

At 210, when the Q counter expires at a value of 1, the Q counter is reloaded. If the current value of the R counter is 0, then at 211, the Q counter is loaded with the value q, the R counter remains at 0 and the M counter is set at a count of M−1, after which the process reverts to step 'A' at 206. If the Q counter expires at the value of 1 and the current value of the R counter has a value other than 0 and the current value of the count in the M counter is greater than or equal to the product of 'f' times the current count value in the R counter, then at 212, the Q counter is loaded with the value q, the R counter remains at its current value and the M counter is set at a count value of M−1. If the Q counter expires at the value of 1 and the current count value in the R counter has a value other than 0 and the current value of the count in the M counter is not greater than or equal to product of 'f' times the current count value in the R counter, then at 213, the Q counter is loaded with the value q+1, the R counter is decremented to a value R−1 and the M counter is set to the value M−1, after which the process reverts to step 'A' at 206.

At 214, when the Q counter expires at a value of 0, the Q counter is reloaded. If the current value of the R counter is 0, then at 215, the Q counter is loaded with the value q−1, the R counter remains at 0 and the M counter is set at a count of M−1, after which the process reverts to step 'A' at 206. If the Q counter expires at the value of 1 and the current value of the R counter as a value other than 0 and the current value of the count in the M counter is greater than or equal to the product of 'f' times the current count value in the R counter, then at 216, the Q counter is loaded with the value q−1, the R counter remains at its current value and the M counter is set at a count value of M−1. If the Q counter expires at the value of 1 and the current count value in the R counter has a value other than 0 and the current value of the count in the M counter is not greater than or equal to product of 'f' times the current count value in the R counter, then at 217, the Q counter is loaded with the value q, the R counter is decremented to a value R−1 and the M counter is set to the value M−1, after which the process reverts to step 'A' at 206.

In another embodiment, the parameter 'f' is calculated by the f-calculator 102 during running of the fractional frequency divider 100. For example, if the input clock has a frequency of 160 MHz and the desired frequency of the output clock is 22.576 MHz, then 160*m/n=22.576 and m/n=1411/10000. The ratio 160/22.576=7.087172 so the output clock's positive edge will appear after every 7 or 7.5 input clock cycles. This implies that q=14, so whenever Q is reloaded, it will be loaded with the value of either 14 or 15. We can write X*7+Y*7.5=10000 or X*14+Y*15=20000, where X+Y=1411. X=1165 and is the number of times the output clock signal's positive edge appears after 7 input clock cycles (per 10000 input clock cycles). Y=246 and is the number of times the output clock signal's positive edge appears after 7.5 input clock cycles (per 10000 input clock cycles). So in the f-calculator module 102, X and Y are maintained as a decrementing counter. X is decremented by 1 if the output clock's positive edge occurs after 7 input-clock-cycles. Y is decremented by 1 if the output clock's positive edge occurs after 7.5 input-clock-cycles. So a value for f is set to equal 1, if 2n(X+Y)>m(qX+(q+1)Y). In this example, 2n(X+Y)>m (14X+15Y). In all other cases, f is set to 0.

FIG. 3 illustrates an example of operation of the N, M, R and Q counters of the counter module 112 of FIG. 1 when the calculated value of the parameter 'f' is used. With reference to FIG. 3, the counting process starts at 300 and enters an initial phase 301 in which the counters are loaded at steps 302 and 303, 304, or 305. When the counters have been loaded, the process moves on to step 'A' at 306 and the counters run. The loading phase 301 repeats each time the N counter reaches a count of 1 (at 307). If 'r' is 0, then (at 303) the Q counter is loaded with the value q, the R counter is loaded with the value 0 and the M counter is loaded with the value m−1. If 'r' has a value other than 0 and f is equal to 1, then (at 304) the Q counter is loaded with the value q, the R counter is loaded with the value r, and the M counter is loaded with the value m−1. If r has a value other than 0 and f is not equal to 1, then (at 305) the Q counter is loaded with the value q−1, the R counter is loaded with the value r−1 and the M counter is loaded with the value m−1.

Until the N counter expires (at a count value of 1), it decrements by one count, at 308, for every input clock pulse. Until the Q counter expires (at a value of either 0 or 1), it decrements by two counts, at 309, for every input clock pulse and the process reverts to step 'A' at 306.

At 310, when the Q counter expires at a value of 1, the Q counter is reloaded. If the current value of the R counter is 0, then at 311, the Q counter is loaded with the value q, the R counter remains at 0 and the M counter is set at a count of M−1, after which the process reverts to step 'A' at 306. If the Q counter expires at the value of 1 and the current value of the R counter as a value other than 0 and f is equal to 1, then at 312, the Q counter is loaded with the value q, the R counter remains at its current value and the M counter is set at a count value of M−1. If the Q counter expires at the value of 1 and the current count value in the R counter has a value other than 0 and f is not equal to 1, then at 313, the Q counter is loaded with the value q+1, the R counter is decremented to a value R−1 and the M counter is set to the value M−1, after which the process reverts to step 'A' at 306.

At 314, when the Q counter expires at a value of 0, the Q counter is reloaded. If the current value of the R counter is 0, then at 315, the Q counter is loaded with the value q−1, the R counter remains at 0 and the M counter is set at a count of M−1, after which the process reverts to step 'A' at 306. If the Q counter expires at the value of 1 and the current value of the R counter has a value other than 0 and f is equal to 1, then at 316, the Q counter is loaded with the value q−1, the R counter remains at its current value and the M counter is set at a count value of M−1. If the Q counter expires at the value of 1 and the current count value in the R counter has a value other than 0 and f is not equal to 1, then at 317, the Q counter is loaded with the value q, the R counter is decremented to a value R−1 and the M counter is set to the value M−1, after which the process reverts to step 'A' at 306.

Advantageously, the calculation of 'f' during running of the fractional frequency divider assists in setting the re-load value of the Q counter so that the positive edges of the output clock signal may be more evenly spaced.

Some examples of the divided clock outputs that can be achieved with the fractional frequency divider of FIG. 1 where the ratio m:n is set at 5:16 will now be described with reference to FIGS. 4-6. Although division and duty-cycle variation can be provided by a divider running only on positive edges of the input clock signal, it is not possible to control the output clock jitter and duty-cycle as precisely as a divider according to an embodiment of the present invention, which uses both positive edges and negative edges. An even spread of clock edges of the divided output clock is also achievable. The even-spread reduces the overall worst jitter. The spread that is achieved is the best possible, when using only digital components in the divider.

In FIG. 4, a first trace 401 represents the digital input clock signal, having a duty cycle of 50%, which is to be divided such that the divided output clock signal comprises 5 pulses for every 16 pulses of the input clock signal. An ideal divided output clock signal would have all its pulses spaced 16/5 (or 3.2) time units apart (where one time unit can be considered to be an input clock period). However, this is not possible to achieve with purely digital dividers. The second trace 402 shows a divided output clock signal, which could be achieved based on using the only positive edges of the input clock signal. This output clock signal has pulses spaced 4, 3, 3, 3, 3, time units apart. Hence the worst jitter for such a positive edge only clock divider is 0.8 time units. The third trace 403 shows the divided output clock signal generated in accordance with an embodiment of the invention using both positive and negative edges of the input clock signal. This permits generation of output clock pulses whose separation (and width) may be set with a granularity of 0.5 time units. This output clock signal has pulses that are spaced 3.5, 3.5, 3, 3, 3 time units apart. Thus, the worst jitter is reduced to 0.6 time units.

Jitter may be reduced even further if the output clock pulses are spaced more evenly. In the example of FIG. 5, an input clock signal having a duty cycle of 50% is shown at trace 501. The second trace 502 shows a divided output clock signal that can be achieved using only the positive edges of the input clock signal and having 5 pulses for every 16 of the input clock signal that are spaced 4, 3, 3, 3, 3 time units apart. The third trace 503 shows the divided output clock signal generated in accordance with an embodiment of the invention using both positive and negative edges of the input clock signal and having five pulses for every 16 pulses of the input clock signal. In this example, the clock pulses are spaced more evenly than in the example of FIG. 4 and are shown in the example of FIG. 5 spaced at 3.5, 3, 3.5, 3, 3 time units apart. This even spacing can be achieved by employing the f calculator as described above with reference to FIG. 3. In this example of FIG. 5, the worst jitter is reduced to 0.4 time units.

FIG. 6 illustrates configurable duty cycles of a divided output clock signal that can be achieved by the embodiments of the present invention. In FIG. 6, trace 601 represents the digital input clock signal, having a duty cycle of 50%, which is to be divided such that the divided output clock signal comprises 5 pulses for every 16 pulses of the input clock signal. As mentioned above, the input 'd' is used to configure duty cycle of the divided output clock signal. With 'Q' as the actual counter output varying from 'q' to 0, the output clock signal is generated by comparing 'd' and 'Q' in the clock gating module 104. In the embodiment of FIG. 1, the input clock signal and the inverted input clock signal are logically ORed together and a positive output pulse appears at the output of the clock gating module only when the corresponding enable signals at the clock gating cells 105, 108 signals are high. This results in the output-clock having the required duty-cycle.

Traces 602-606 show divided clock output signals having spacings of 3.5, 3, 3.5, 3, 3 time units but whose positive pulse widths are variable with a granularity of one input cycle pulse width. Trace 602 has positive pulse widths equal to just one input pulse width (m=5, n=16 and d=0). For example, the first output pulse is generated by enabling the first clock gating cell for one input clock cycle and the second output pulse is generated by enabling the second clock gating cell for one input clock cycle. Trace 603 has positive pulse widths equal to two input pulse widths (m=5, n=16 and d=1). Each output pulse is generated by enabling both first and second clock gating cells for one input clock cycle. Trace 604 has positive pulse widths equal to three input pulse widths (m=5, n=16 and d=2). Each output pulse is generated by enabling the first clock gating cell for two input clock cycles and enabling the second clock gating cell for one input clock cycle. Similarly, the traces 605 and 606 are generated by setting the value of 'd' to 3 and 4 respectively. The value of the configurable parameter 'd' controls the width of the positive pulse of the output clock and thus the duty cycle.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation. A single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Further, the entire functionality of the modules shown in FIG. 1 may be implemented in an integrated circuit. Such an integrated circuit may be a package containing one or more dies. Alternatively, the examples may be implemented as any number of separate integrated circuits or separate devices interconnected with each other in a suitable manner. An integrated circuit device may comprise one or more dies in a single package with electronic components provided on the dies that form the modules and which are connectable to other components outside the package through suitable connections such as pins of the package and bondwires between the pins and the dies.

Also for example, the examples, or portions thereof, may implemented as soft or code representations of physical circuitry or of logical representations convertible into physical circuitry, such as in a hardware description language of any appropriate type.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A fractional frequency divider for dividing a digital input clock signal by a fraction m/n, wherein a divided output signal has m pulses for every n pulses of the input signal, the fractional frequency divider comprising:
    a counter for counting input clock signal pulses, wherein the counter comprises a first counter module that is a down-counter initially loaded with the value 2n/m−1 and arranged to decrement by 2 with every input clock pulse;
    a clock gating module including a first clock gating cell for receiving the input clock signal;
    a second clock gating cell for receiving an inverted version of the input clock signal, wherein the first and second clock gating cells are arranged to enable a pulse of the input clock signal and a pulse of the inverted version of the input clock signal to pass to respective outputs thereof when an output of the counter reaches a preset value; and
    a combiner for combining the outputs of the first and second clock gates.

2. The fractional frequency divider of claim 1, wherein the combiner comprises an OR gate.

3. The fractional frequency divider of claim 1, wherein the first counter module decrements by one at the start of a subsequent cycle after counting down to zero.

4. The fractional frequency divider of claim 1, further comprising a second counter module that is a down-counter initially loaded with the value 'n' and arranged to decrement by one count for every input clock pulse and to reload with the value 'n' on counting down to a count value of one.

5. The fractional frequency divider of claim 1, wherein:
    the clock gating module compares the output of the counter with a configurable parameter, and
    the first and second clock gating cells enable a pulse of the input clock signal and a pulse of the inverted version of the input clock signal to pass to respective outputs thereof depending on the comparison.

* * * * *